(12) United States Patent
Wang et al.

(10) Patent No.: US 12,356,632 B2
(45) Date of Patent: Jul. 8, 2025

(54) MEMORY DEVICE AND PREPARING METHOD THEREOF

(71) Applicants: CHANGXIN MEMORY TECHNOLOGIES, INC., Hefei (CN); BEIJING SUPERSTRING ACADEMY OF MEMORY TECHNOLOGY, Beijing (CN)

(72) Inventors: Xiaoguang Wang, Hefei (CN); Dinggui Zeng, Hefei (CN); Huihui Li, Hefei (CN); Kanyu Cao, Hefei (CN)

(73) Assignees: CHANGXIN MEMORY TECHNOLOGIES, INC., Hefei (CN); BEIJING SUPERSTRING ACADEMY OF MEMORY TECHNOLOGY, Beijing (CN)

(*) Notice: Subject to any disclaimer, the term of this patent is extended or adjusted under 35 U.S.C. 154(b) by 357 days.

(21) Appl. No.: 17/808,396

(22) Filed: Jun. 23, 2022

(65) Prior Publication Data
US 2023/0065326 A1     Mar. 2, 2023

Related U.S. Application Data

(63) Continuation of application No. PCT/CN2022/078533, filed on Mar. 1, 2022.

(30) Foreign Application Priority Data

Aug. 30, 2021  (CN) .......................... 202111007065.5

(51) Int. Cl.
H10B 61/00     (2023.01)
H10D 30/67     (2025.01)

(52) U.S. Cl.
CPC ......... *H10B 61/22* (2023.02); *H10D 30/6728* (2025.01); *H10D 30/6755* (2025.01)

(58) Field of Classification Search
CPC .............. H10B 61/22; H01L 29/78642; H01L 29/7869; H10D 30/6755; H10D 30/6728
See application file for complete search history.

(56) References Cited

U.S. PATENT DOCUMENTS 7,173,841 B2    2/2007  Peng et al.
11,024,719 B2   6/2021  Sawabe et al.
(Continued)

FOREIGN PATENT DOCUMENTS

CN       1815623 A       8/2006
CN     108461496 A       8/2018
(Continued)

OTHER PUBLICATIONS

International Search Report cited in PCT/CN2022/091926 mailed Jul. 25, 2022, 9 pages.
(Continued)

*Primary Examiner* — Shih Tsun A Chou
(74) *Attorney, Agent, or Firm* — Kilpatrick Townsend & Stockton LLP

(57) ABSTRACT

The present application relates to a memory device and a preparing method thereof. The memory device includes: a substrate, and a plurality of memory cells disposed in an array on the substrate. Memory cells in adjacent rows are staggered in a row direction, and a distance between two adjacent memory cells in any row is a first distance. Memory cells in adjacent columns are staggered in a column direction, and a staggered distance is less than the first distance.

14 Claims, 14 Drawing Sheets

(56) References Cited

U.S. PATENT DOCUMENTS

| | | | |
|---|---|---|---|
| 11,309,353 B2 | 4/2022 | Goto et al. | |
| 2010/0097835 A1 | 4/2010 | Popp et al. | |
| 2020/0303453 A1* | 9/2020 | Nakayama | H10N 50/85 |
| 2020/0381450 A1 | 12/2020 | Lue et al. | |
| 2022/0285350 A1* | 9/2022 | Okajima | H10D 30/6755 |

FOREIGN PATENT DOCUMENTS

| | | | |
|---|---|---|---|
| CN | 108493188 A | 9/2018 |
| CN | 111710724 A | 9/2020 |
| CN | 112038345 A | 12/2020 |
| CN | 113140588 A | 7/2021 |
| JP | 2010114369 A | 5/2010 |
| WO | 2020181410 A1 | 9/2020 |

OTHER PUBLICATIONS

International Search Report cited in PCT/CN2022/078533 mailed May 20, 2022, 9 pages.

* cited by examiner (a)

(b)

MEMORY DEVICE AND PREPARING METHOD THEREOF

CROSS-REFERENCE TO RELATED APPLICATIONS

This is a continuation of International Application No. PCT/CN2022/078533, filed on Mar. 1, 2022, which claims the priority to Chinese Patent Application No. 202111007065.5, titled "MEMORY DEVICE AND PREPARING METHOD THEREOF" and filed with China National Intellectual Property Administration (CNIPA) on Aug. 30, 2021. The entire contents of International Application No. PCT/CN2022/078533 and Chinese Patent Application No. 202111007065.5 are incorporated herein by reference.

TECHNICAL FIELD

The present application relates to the technical field of semiconductor integrated circuit manufacturing, and in particular, to a memory device and a preparing method thereof.

BACKGROUND

As a non-volatile memory, a magnetoresistive random-access memory (MRAM) may have a high-speed read and write capability of a static random-access memory (SRAM), and may further have a high-density integration capability of a dynamic random-access memory (DRAM).

The MRAM has a high-density integration capability which is beneficial to reducing production costs, and may also be used as one of core competencies of the MRAM compared to other conventional non-flash memories. However, how to further improve the high-density integration capability of the MRAM is also a difficult problem to be resolved urgently in the related art.

SUMMARY

Some embodiments of the present disclosure provide a memory device. The memory device includes: a substrate, and a plurality of memory cells disposed in an array on the substrate. Memory cells in adjacent rows are staggered in a row direction, and a distance between two adjacent memory cells in any row is a first distance. Memory cells in adjacent columns are staggered in a column direction, and a staggered distance is less than the first distance.

Some embodiments of the present disclosure further provide a method of preparing a memory device, used to prepare the memory device in some of the foregoing embodiments. The method of preparing the memory device includes:

providing a substrate, and forming a common source line on the substrate;

forming a plurality of gate word lines disposed in parallel at intervals on the common source line, wherein the gate word line extends in a first direction;

forming a plurality of through holes provided in an array on the substrate, wherein the through hole penetrates the gate word line and extends to an upper surface of the common source line; and through holes in adjacent rows are staggered in a row direction, and through holes in adjacent columns are staggered in a column direction;

forming a gate dielectric layer on a sidewall of the through hole, and forming a columnar structure on an inner side of the gate dielectric layer, wherein a bottom of the columnar structure is in contact with the common source line, and a top of the columnar structure is higher than an upper surface of the gate dielectric layer;

forming a memory module on the top of the columnar structure; and forming a plurality of bit lines disposed in parallel at intervals above the memory module, wherein the bit line extends in a second direction, and the bit line is correspondingly connected to the memory module; and the second direction intersects with the first direction.

BRIEF DESCRIPTION OF THE DRAWINGS

To describe the technical solutions in the embodiments of the present disclosure or in the conventional art more clearly, the following briefly describes the accompanying drawings required for describing the embodiments or the conventional art. Apparently, the accompanying drawings in the following description show merely some embodiments of the present application, and a person of ordinary skill in the art may still derive other accompanying drawings from these accompanying drawings without creative efforts.

REFERENCE NUMERALS

Figure 1:
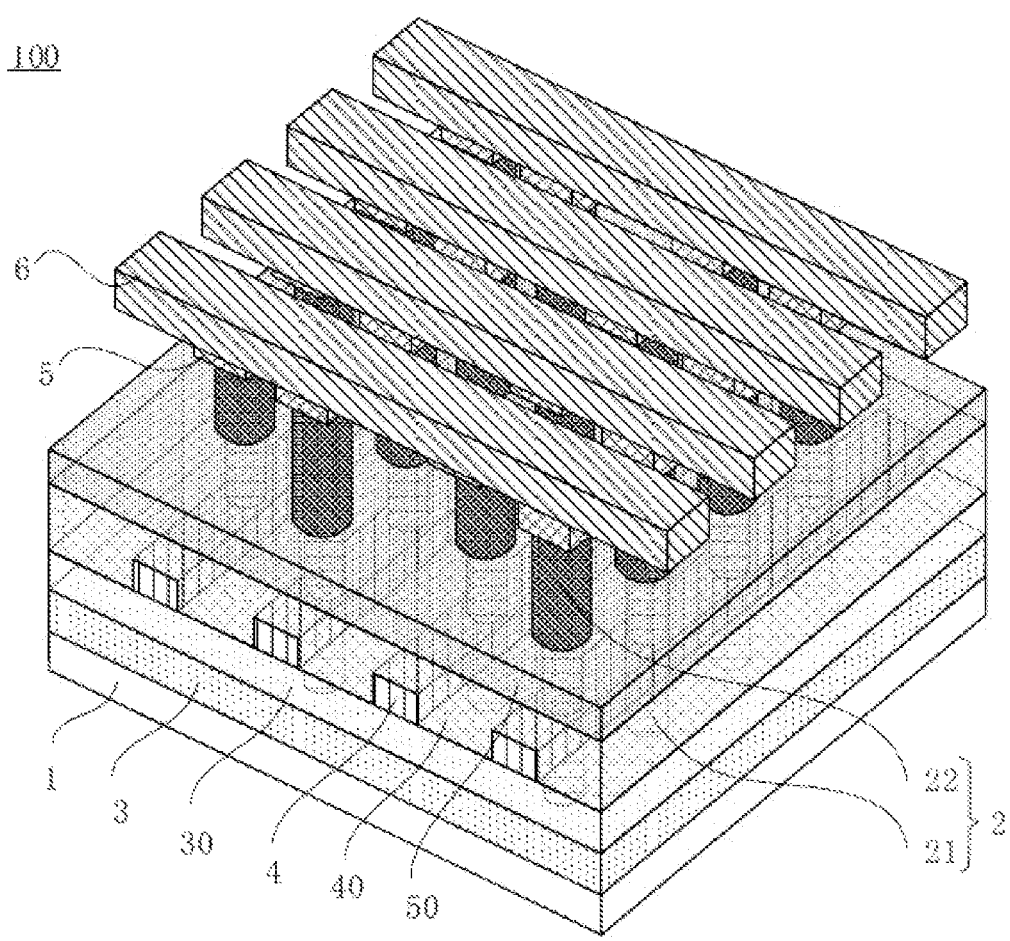
FIG. 1 is a schematic structural diagram of a memory device according to an embodiment.

100—Memory device, 1—Substrate, 2—Memory cell, 21—Gate-all-around transistor, 211—Columnar structure,
212—Gate dielectric layer, 213—Source, 213—Drain, 22—Memory module, 220— magnetic tunnel junction material layer,
3—Common source line, 4—Gate word line, 41—Metal material layer, 30—First dielectric layer, 40—second dielectric layer,
50—Third dielectric layer, 5—Storage node contact structure, 6—Bit line,
$D_1$—Distance between two adjacent memory cells in any row, $D_2$—Staggered distance of memory cells in adjacent columns in a column direction, $D_3$—Staggered distance of memory cells in adjacent rows in a row direction, $D_4$—Distance between two memory cells that are correspondingly staggered and that have a same sequence number in adjacent rows, $D_5$—Distance between two adjacent memory cells in any column, R1 to R4—Row sequence number, L1 to L8—Column sequence number.

DETAILED DESCRIPTION

To facilitate the understanding of the present application, the present application is described more completely below with reference to the accompanying drawings. The embodiments of the present application are provided in the accompanying drawings. However, the present application may be embodied in various forms without being limited to the embodiments described herein. These embodiments are provided in order to make the present application more thorough and comprehensive.

Unless otherwise defined, all technical and scientific terms used herein have the same meaning as commonly understood by those skilled in the technical field of the present application. The terms used in the specification of the present application are merely for the purpose of describing specific embodiments, rather than to limit the present application.

It should be understood that when an element or a layer is described as "being on", "being adjacent to", "being connected to", or "being coupled to" another element or layer, it can be on, adjacent to, connected to, or coupled to the another element or layer directly, or intervening elements or layers may be present. On the contrary, when an element is described as "being directly on", "being directly adjacent to", "being directly connected to" or "being directly coupled to" another element or layer, there are no intervening elements or layers.

It should be understood that although terms such as first and second may be used to describe various elements, components, regions, layers, doped types and/or sections, these elements, components, regions, layers, doped types and/or sections should not be limited by these terms. These terms are only used to distinguish one element, component, region, layer, doped type or section from another element, component, region, layer, doped type or section. Therefore, without departing from the teachings of the present application, the first element, component, region, layer, doped type or section discussed below may be expressed as a second element, component, region, layer or section.

Spatial relationship terms such as "under", "beneath", "lower", "below", "above", and "upper" can be used herein to describe the relationship between one element or feature and another element or feature shown in the figure. It should be understood that in addition to the orientations shown in the figure, the spatial relationship terms further include different orientations of used and operated devices. For example, if a device in the accompanying drawings is turned over, an element or feature described as being "beneath another element", "below it", or "under it" is oriented as being "on" another element or feature. Therefore, the exemplary terms "beneath" and "under" may include two orientations of above and below. In addition, the device may further include other orientations (for example, a rotation by 90 degrees or another orientation), and the spatial description used herein is interpreted accordingly.

When used herein, the singular forms of "a", "an" and "the/this" may also include plural forms, unless clearly indicated otherwise. It should also be understood that the terms such as "including/comprising" and "having" indicate the existence of the stated features, wholes, steps, operations, components, parts or combinations thereof. However, these terms do not exclude the possibility of the existence of one or more other features, wholes, steps, operations, components, parts or combinations thereof. In this case, in this specification, the term "and/or" includes any and all combinations of related listed items.

The embodiments of the present disclosure are described herein with reference to cross-sectional views used as schematic diagrams of idealized embodiments (and intermediate structures) of the present disclosure, such that variations shown in the shapes can be contemplated due to, for example, manufacturing techniques and/or tolerances. Therefore, the embodiments of the present disclosure should not be limited to the specific shapes of the regions shown herein, but include shape deviations caused by, for example, manufacturing techniques. The regions shown in the figure are schematic in nature, and their shapes are not intended to show the actual shapes of the regions of the device and limit the scope of the present disclosure.

In the technical field of semiconductor integrated circuit manufacturing, the integration density of various electronic devices can be continuously increased by, for example, reducing a minimum component size and/or arranging the electronic devices close to each other to integrate the various electronic devices into a specific region. The various electronic devices include: a transistor, a diode, a resistor, a capacitor, or the like.

Currently, the high-density integration capability of the MRAM may enable a storage range of the MRAM to be increased from Mb to Gb. However, how to further enable the storage range of the MRAM to be increased from 1 Gb to 8 Gb or higher further needs to be resolved urgently.

Embodiments of the present disclosure provide a memory device and a preparing method thereof, to further improve an integration density of memory cells in the memory device, and effectively reduce a contact resistance between the memory cell and a bit line, so as to ensure that the memory device has good and stable storage performance while having a high-density integration capability.

Figure 2:
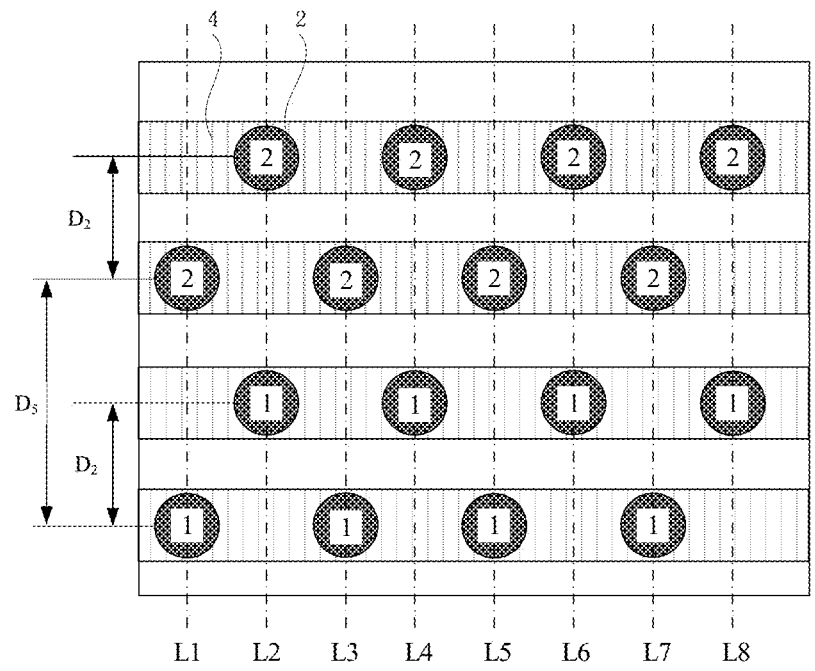
FIG. 2 is a schematic diagram of distribution of memory cells according to an embodiment.
Figure 2:
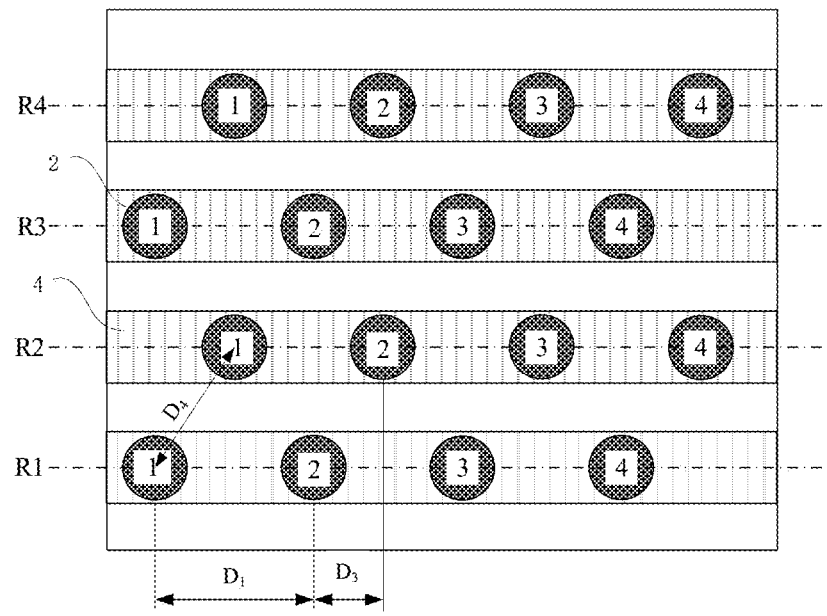

Based on this, referring to FIG. 1 and FIG. 2, some embodiments of the present disclosure provide a memory device 100. The memory device 100 includes: a substrate 1, and a plurality of memory cells 2 disposed in an array on the substrate.

With reference to FIG. 1 and FIG. 2 for understanding, memory cells 2 in adjacent rows are staggered in a row direction, and a distance $D_1$ between two adjacent memory cells 2 in any row is a first distance. Memory cells 2 in adjacent columns are staggered in a column direction, and a staggered distance $D_2$ is less than the first distance. That is, $D_2$ is less than $D_1$.

Herein, the first distance is, for example, two times a minimum process size F. The minimum process size F is a minimum size that can be implemented in manufacturing using a process, which is also referred to as a key size, and may be used as a criterion for defining a manufacturing process level.

In an embodiment of the present disclosure, the staggered distance $D_2$ of the memory cells 2 in the adjacent columns in the column direction is: a distance component between memory cells 2 having a same sequence number in the adjacent columns in the column direction. For example, as shown in figure (a) in FIG. 2, column sequence numbers are arranged from left to right (for example, L1 to L8), and sequence numbers of memory cells 2 in a same column are arranged from bottom to top. In this way, the staggered distance $D_2$ of the memory cells 2 in the adjacent columns in the column direction is, for example, a distance component between the first memory cell 2 in the first column L1 and the first memory cell 2 in the second column L2 in the column direction.

Similarly, a staggered distance $D_3$ of memory cells 2 in adjacent rows in a row direction is: a distance component between memory cells 2 having a same sequence number in the adjacent rows in the row direction. For example, as shown in figure (b) in FIG. 2, row sequence numbers are arranged from bottom to top (for example, R1 to R4), and sequence numbers of memory cells 2 in a same row are arranged from left to right. In this way, the staggered distance $D_3$ of the memory cells 2 in the adjacent rows in the row direction is, for example, a distance component of the second memory cell 2 in the first row R1 and the second memory cell 2 in the second row R2 in the row direction.

Figure 3:
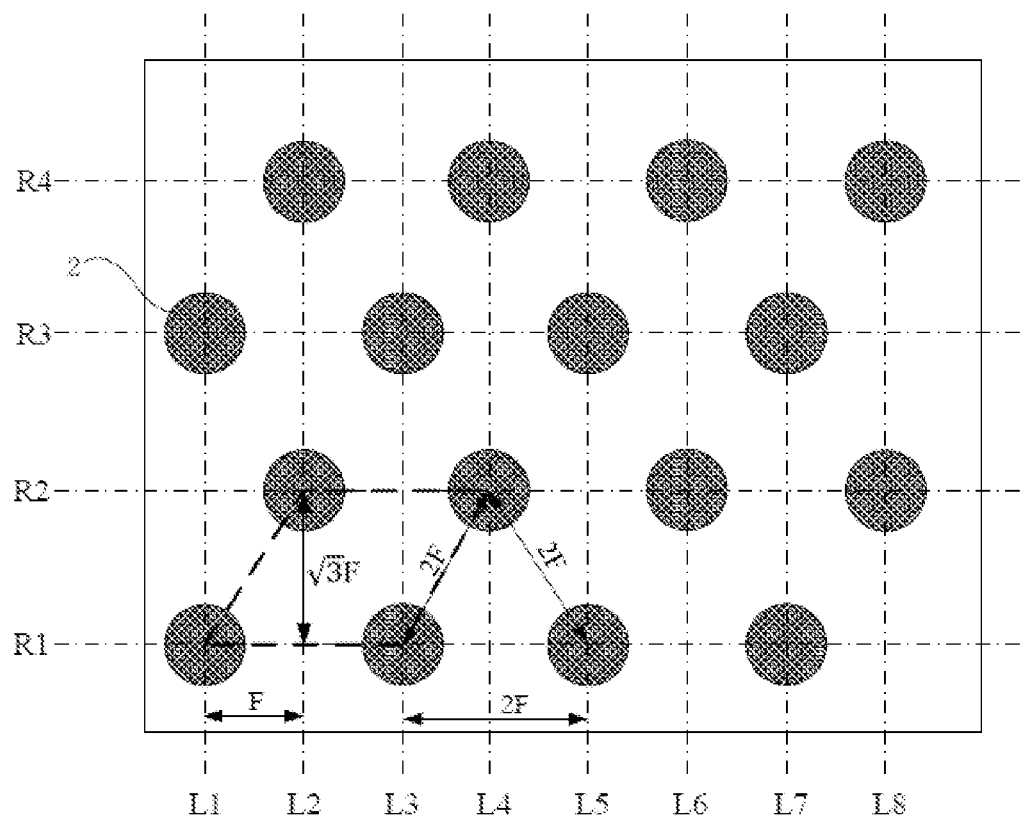
FIG. 3 is another schematic diagram of distribution of memory cells according to an embodiment.

Based on this, with reference to FIG. 2 and FIG. 3 for understanding, in a case that the memory cells 2 in the adjacent rows are staggered in the row direction, and the memory cells 2 in the adjacent columns are staggered in the column direction, a distance $D_4$ between two memory cells 2 that are correspondingly staggered and that have a same sequence number in adjacent rows may be minimized to 2F with accordance to a manufacturing process level. In this way, the staggered distance $D_2$ of the memory cells 2 in the adjacent columns in the column direction may be determined according to the staggered distance $D_3$ of the memory cells 2 in the adjacent rows in the row direction. Correspondingly, a distance $D_5$ between two adjacent memory cells 2 in any column is two times $D_2$.

That is, in this embodiment of the present disclosure, the memory cells 2 in the adjacent rows are staggered in the row direction, the memory cells 2 in the adjacent columns are staggered in the column direction, and the staggered distance of the memory cells 2 in the adjacent columns in the column direction is less than the first distance, such that a size of a plane area that each memory cell needs to occupy can be properly reduced on a premise of meeting a process manufacturing capability, thereby ensuring a higher distribution density of the plurality of memory cells 2.

For example, still referring to FIG. 2, the staggered distance $D_2$ of the memory cells 2 in the adjacent columns in the column direction is less than or equal to the second distance. The second distance is greater than half of the first distance, and the second distance is less than the first distance. For example, $F<D_2<2F$.

Optionally, referring to FIG. 3, the staggered distance $D_2$ of the memory cells 2 in the adjacent columns in the column direction is equal to $\sqrt{3}F$. However, this is not limited herein.

In this way, the size of the plane area that each memory cell 2 can occupy is $\sqrt{3}F^2$, which is approximately equal to $3.46F^2$. An integration density of the memory cells 2 in the memory device 100 is effectively increased in this embodiment of the present disclosure.

For example, still referring to FIG. 2, the staggered distance $D_3$ of the memory cells 2 in the adjacent rows in the row direction is less than or equal to half of the first distance. For example, $D_3 \leq F$.

Optionally, referring to FIG. 3, the staggered distance $D_3$ of the memory cells 2 in the adjacent rows in the row direction is equal to F; correspondingly, the staggered distance $D_2$ of the memory cells 2 in the adjacent columns in the column direction is equal to $\sqrt{3}F$.

In this way, in a case that the distance $D_1$ between two adjacent memory cells 2 in any row is, for example, 2F, and the distance $D_4$ between two memory cells 2 that are correspondingly staggered and that have a same sequence number in adjacent rows is, for example, 2F, the staggered distance $D_2$ of the memory cells 2 in the adjacent columns in the column direction may be correspondingly determined according to a size of the staggered distance $D_3$ of the memory cells 2 in the adjacent rows in the row direction. This helps determine the distance between the memory cells 2 in the adjacent columns in the column direction by designing the distance between the memory cells 2 in the adjacent rows in the row direction.

Still referring to FIG. 1, in some embodiments, the memory device 100 further includes: a common source line 3 disposed between the substrate 1 and the memory cell 2, and a plurality of gate word lines 4 that are disposed in parallel at intervals and that extend in a first direction. The gate word line 4 is located on the common source line 3, and is correspondingly connected to the memory cell 2.

Herein, the first direction is, for example, the row direction, or may be a direction provided at an included angle to the row direction.

Optionally, the common source line 3 covers the entire surface of the substrate 1. The common source line 3 is, for example, a transparent conductive layer, a molybdenum (Mo) layer, an aluminum (Al) layer, a stacked layer of titanium (Ti) and gold (Au), or the like. The transparent conductive layer is, for example, an indium tin oxide (ITO) film.

It may be understood that, the gate word line 4 is located on the common source line 3, and the gate word line 4 is connected to the common source line 3 in an insulating manner. For example, a first dielectric layer 30 is provided between the gate word lines 4 and the common source line 3. Optionally, the first dielectric layer 30 is an oxide layer, for example, a silicon oxide layer.

In addition, still referring to FIG. 1, the memory device 100 further includes: a second dielectric layer 40 covering the gate word lines 4. The second dielectric layer 40 is configured to insulate adjacent gate word lines 4, and planarize a surface of a structure obtained after the gate word lines 4 are formed, to help perform a subsequent production process. Optionally, the second dielectric layer 40 is an oxide layer, for example, a silicon oxide layer. Alternatively, the second dielectric layer 40 is an organic insulating layer.

Optionally, the gate word lines 4 extend in the row direction, and one gate word line 4 is correspondingly connected to memory cells 2 in one row. The gate word line 4 is, for example, a metal line, and may be formed by using a metal material with good electrical conductivity. This is not limited in this embodiment of the present disclosure.

Still referring to FIG. 1, in some embodiments, the memory cell 2 includes: a gate-all-around transistor 21 and a memory module 22. The gate-all-around transistor 21 is disposed on the common source line 3 and is connected to the common source line 3. The gate-all-around transistor 21 is further correspondingly connected to the gate word line 4. The memory module 22 is disposed on the gate-all-around transistor 21 and is connected to the gate-all-around transistor 21.

Herein, a quantity of memory modules 22 is the same as that of gate-all-around transistors 21, that is, one memory module 22 is correspondingly disposed on one gate-allaround transistor 21. In this way, it is beneficial to ensuring that the memory device 100 has a relatively high density integration capability.

For example, the memory module 22 is an MRAM module. For example, the memory module 22 is a magnetic tunnel junction (MTJ) disposed in a columnar shape. Optionally, the MTJ includes a free layer, a fixed layer, and an oxide layer (Tunneling oxide) that are provided in a stacked manner in a direction far away from the substrate. However, this is not limited herein. Another type of memory module is also applicable.

Figure 4:
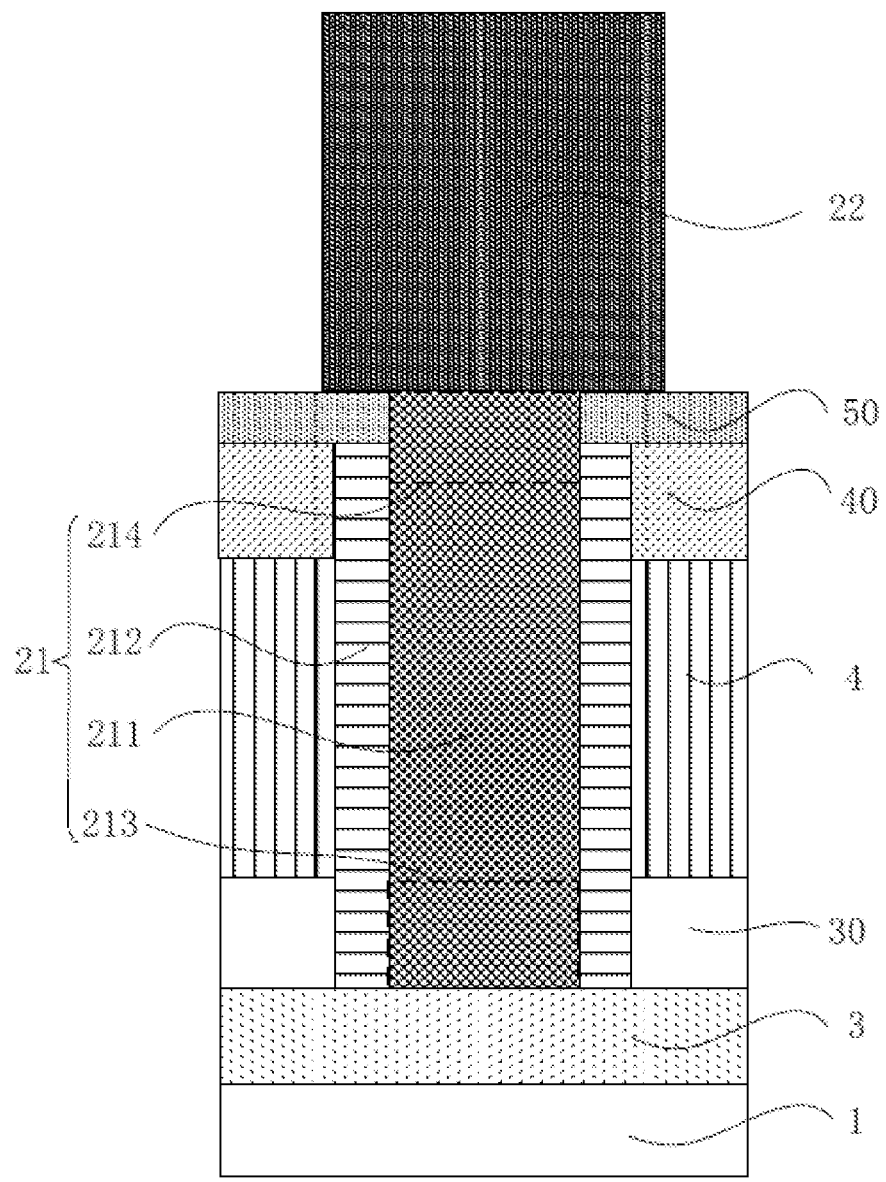
FIG. 4 is a schematic diagram of a cross section of a memory cell according to an embodiment.

For example, referring to FIG. 4, the gate-all-around transistor 21 includes: a columnar structure 211, a gate dielectric layer 212, a source 213, and a drain 214. A bottom of the columnar structure 211 is in contact with the common source line 3, and a top of the columnar structure 211 penetrates the gate word line 4 and extends to the memory module 22. The gate dielectric layer 212 is located between the columnar structure 211 and the gate word line 4, and the gate dielectric layer 212 wraps a part of the columnar structure 211. The source 213 is located at the bottom of the columnar structure 211 and is in contact with the common source line 3. The drain 214 is located at the top of the columnar structure 211 and is in contact with the memory module 22.

Herein, the source 213 and the drain 214 may be constituted by some regions of the columnar structure 211, such that a part of the columnar structure 211 located between the source 213 and the drain 214 is a conductive channel. In this way, the gate dielectric layer 212 wraps at least the conductive channel. The gate word line 4 is located at the periphery of the gate dielectric layer 212, and a part of the gate word line 4 may be used as a gate of the gate-all-around transistor 21.

For example, the gate dielectric layer 212 may be formed by using a material with a high k dielectric constant. For example, the material of the gate dielectric layer 212 includes: aluminum oxide ($Al_2O_3$), hafnium oxide ($HfO_2$), hafnium oxide nitrogen (HfON), zirconium oxide ($ZrO_2$), tantalum oxide ($Ta_2O_5$), titanium oxide ($TiO_2$), or strontium titanium oxide ($SrTiO_3$).

For example, the columnar structure 211 may be formed by using a metal oxide semiconductor material. For example, the material of the columnar structure 211 includes indium gallium zinc oxide (IGZO), indium zinc oxide (IZO), or indium tin oxide (ITO).

Optionally, the material of the columnar structure 211 includes indium gallium zinc oxide (IGZO). In this way, the gate-all-around transistor 21 and the memory device 100 may have a relatively low process temperature, which is, for example, less than equal to 300° C., to prevent the memory device 100 from being defective due to a high temperature process. In addition, the columnar structure 211 is formed by using IGZO, such that the gate-all-around transistor 21 can be ensured to have a relatively high on/off current ratio (Ion/Ioll), which is, for example, greater than or equal to $10^8$, to further ensure that the gate-all-around transistor 21 has a good electrical property, thereby meeting a drive requirement of the memory device 100, especially a drive requirement of the MTJ.

Moreover, the columnar structure 211 is formed by using IGZO and therefore is easily generated and formed on various surfaces, for example, may be extended from a two-dimensional (2D) surface to a three-dimensional surface (3D), to meet different requirements of a two-dimensional memory device 100 or a three-dimensional memory device.

It should be additionally noted that, with reference to FIG. 1 and FIG. 4 for understanding, in some embodiments, an upper surface of the substrate 1 is used as a reference plane, and a surface of the columnar structure 211 facing away from the substrate 1 is higher than a surface of the gate dielectric layer 212 facing away from the substrate 1. A surface of the gate dielectric layer 212 facing away from the substrate 1 is flush with a surface of the second dielectric layer 40 facing away from the substrate 1, or a surface of the gate dielectric layer 212 facing away from the substrate 1 is higher than a surface of the second dielectric layer 40 facing away from the substrate 1.

Based on this, the memory device 100 further includes: a third dielectric layer 50 covering the second dielectric layer 40 and the surface of the gate dielectric layer 212 facing away from the substrate 1. A surface of the third dielectric layer 50 facing away from the substrate 1 is flush with the surface of the columnar structure 211 facing away from the substrate. This is beneficial to simplifying a process of forming the memory module 22 on the columnar structure 211, and ensuring that the memory module 22 can be in good contact with the columnar structure 211. Optionally, the third dielectric layer 50 is an oxide layer, for example, a silicon oxide layer. Alternatively, the third dielectric layer 50 is an organic insulating layer.

Figure 5:
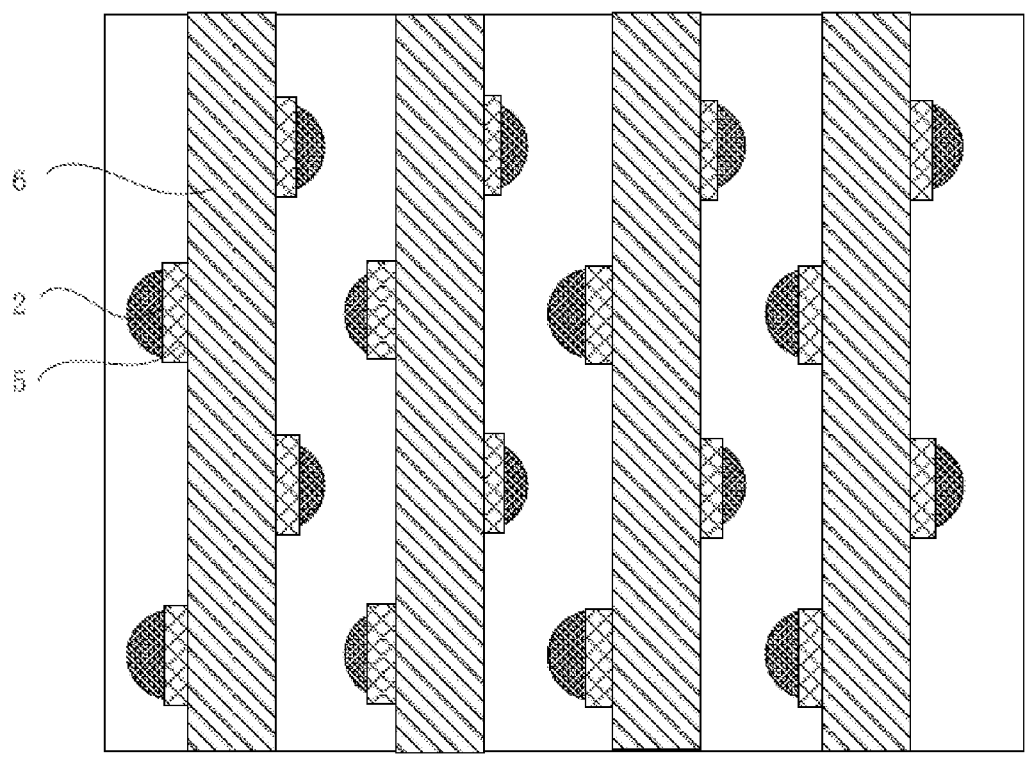
FIG. 5 is a schematic diagram of distribution of a memory cell, a storage node contact structure, and a bit line according to an embodiment.

With reference to FIG. 1 and FIG. 5 for understanding, in some embodiments, the memory device 100 further includes a plurality of storage node contact structures 5 (SNC). The storage node contact structure 5 is located on the memory cell 2, and covers at least a part of the memory cell 2.

For example, the storage node contact structure 5 is formed on an upper surface of the memory module 22, that is, a surface of the memory module 22 facing away from the substrate 1 is in contact with the memory module 22. A structure of the storage node contact structure 5 may be selected and provided according to an actual requirement. Optionally, the storage node contact structure 5 is a metal pad, for example, a tungsten pad. Therefore, it can be ensured that the storage node contact structure 5 has a relatively low resistance value and relatively high stability.

For example, shapes of orthographic projection of the storage node contact structure 5 on the substrate 1 include a rectangle. In this way, in a case that the memory module 22 is an MTJ disposed in a columnar shape, the storage node contact structure 5 adopts a rectangular structure, and the storage node contact structure 5 covers at least a part of the MTJ. This helps storage node contact structures 5 in adjacent columns have parts located on a same straight line or located in a region beside a same straight line.

Still referring to FIG. 1 and FIG. 5, in some embodiments, the memory device 100 further includes: a plurality of bit lines 6 that are disposed in parallel at intervals and that extend in a second direction. The bit line 6 is located on a corresponding storage node contact structure 5, and is correspondingly connected to the memory cell 2 through the corresponding storage node contact structure 5. The second direction intersects with, for example, is perpendicular to, the first direction.

Herein, the second direction is, for example, the column direction, or may be a direction provided at an included angle to the column direction.

Optionally, the bit lines 6 extend in the column direction, and one bit line 6 is correspondingly connected to storage node contact structures 5 on memory cells 2 in two adjacent columns. The bit line 6 is, for example, a metal line, and may be formed by using a metal material with good electrical conductivity. This is not limited in this embodiment of the present disclosure.

In this embodiment of the present disclosure, the bit line 6 is located at a top of the memory cell 2, and one bit line 6 is correspondingly connected to memory cells 2 on two adjacent columns. In this way, in a case that the memory cells 2 have a relatively high distribution density, the bit line 6 can be designed to have a relatively large line width size, to effectively reduce a contact resistance between the bit line 6 and the memory cell 2 and avoid a high resistance caused by embedded arrangement of the bit line 6. This can ensure that the memory device 100 has good and stable storage performance while having a high-density integration capability.

Figure 6:
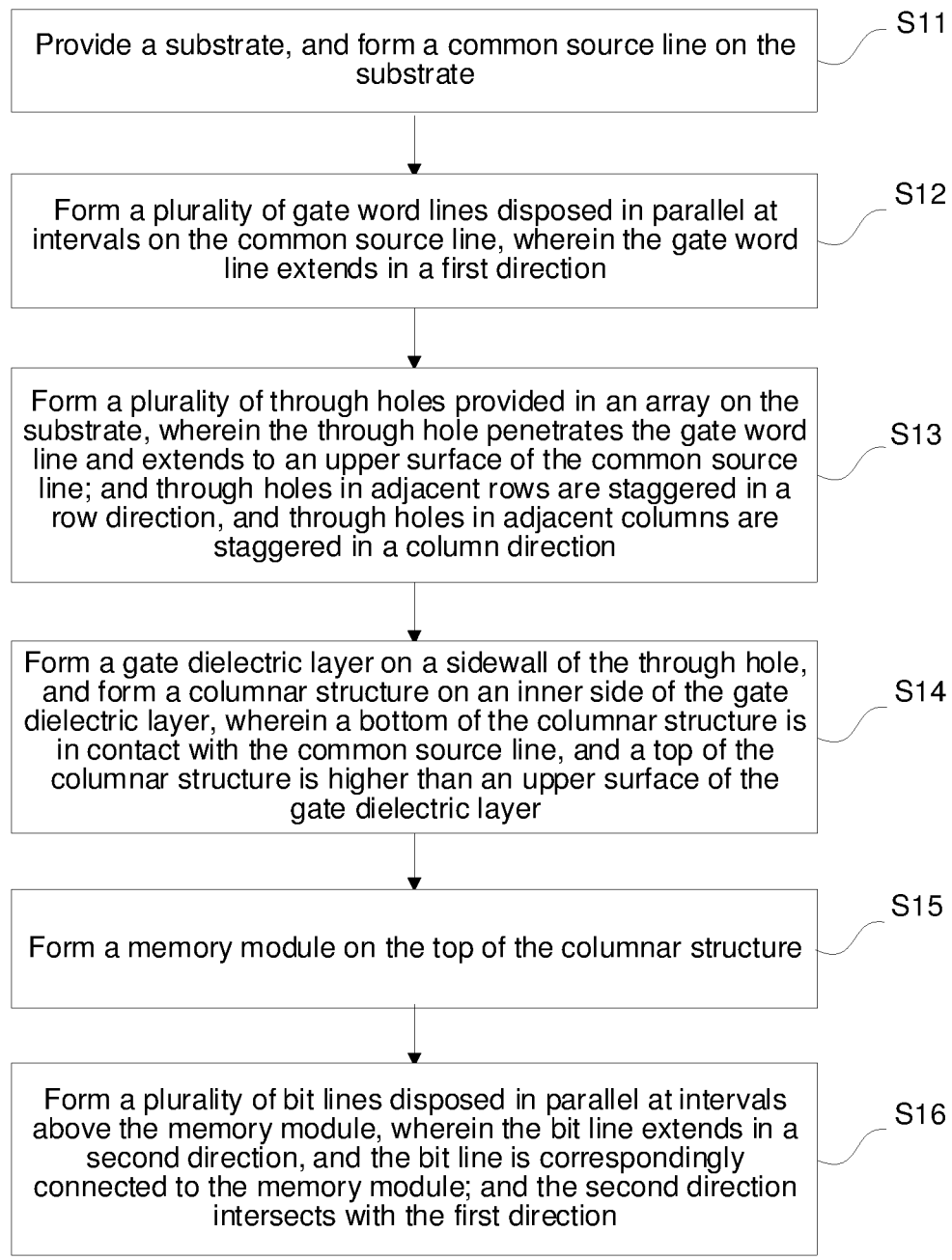
FIG. 6 is a schematic flowchart of a method of preparing a memory device according to an embodiment.

Referring to FIG. 6, some embodiments of the present disclosure further provide a method of preparing a memory device, used to prepare the memory device in some of the foregoing embodiments. The method of preparing the memory device includes the steps as described below:

S11: Provide a substrate, and form a common source line on the substrate.

Figure 7:
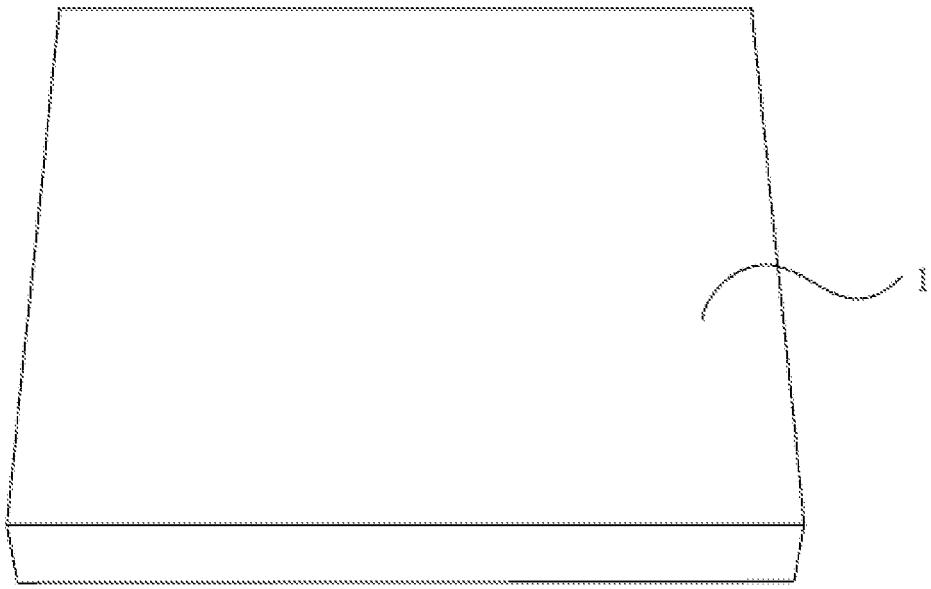
FIG. 7 and FIG. 8 are schematic structural diagrams of a structure obtained in step S11 according to an embodiment.

Referring to FIG. 7, for example, a substrate 1 is provided, and the substrate 1 includes but is not limited to a silicon substrate or a silicon-based substrate.

Figure 8:
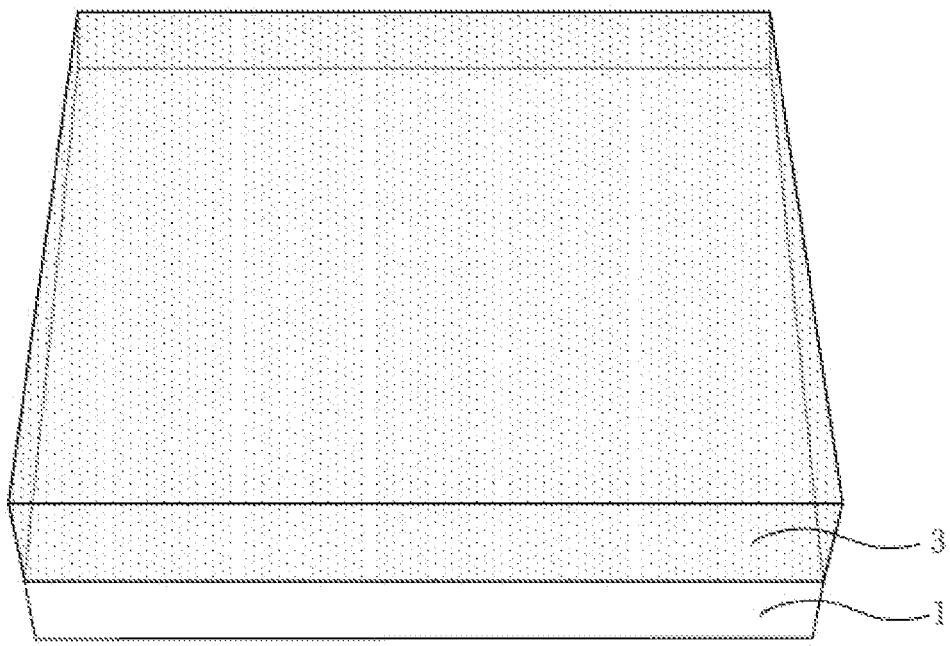

Referring to FIG. 8, for example, the common source line 3 is formed on the substrate 1, and the common source line 3 covers the entire surface of the substrate 1. The common source line 3 is, for example, a transparent conductive layer, a molybdenum (Mo) layer, an aluminum (Al) layer, a stacked layer of titanium (Ti) and gold (Au), or the like. The transparent conductive layer is, for example, an indium tin oxide (ITO) film.

Optionally, the common source line 3 is formed through a deposition process, which includes but is not limited to a physical vapor deposition (PVD), a chemical vapor deposition (CVD), or an atomic Layer deposition (ALD).

In addition, after the common source line 3 is formed, chemical mechanical polishing (CMP) may be performed on an obtained structure, to ensure surface planarization of the obtained structure.

S12: Form a plurality of gate word lines disposed in parallel at intervals on the common source line, where the gate word line extends in a first direction.

Herein, the first direction is, for example, the row direction in the foregoing embodiments, or may be a direction provided at an included angle to the row direction.

Figure 9:
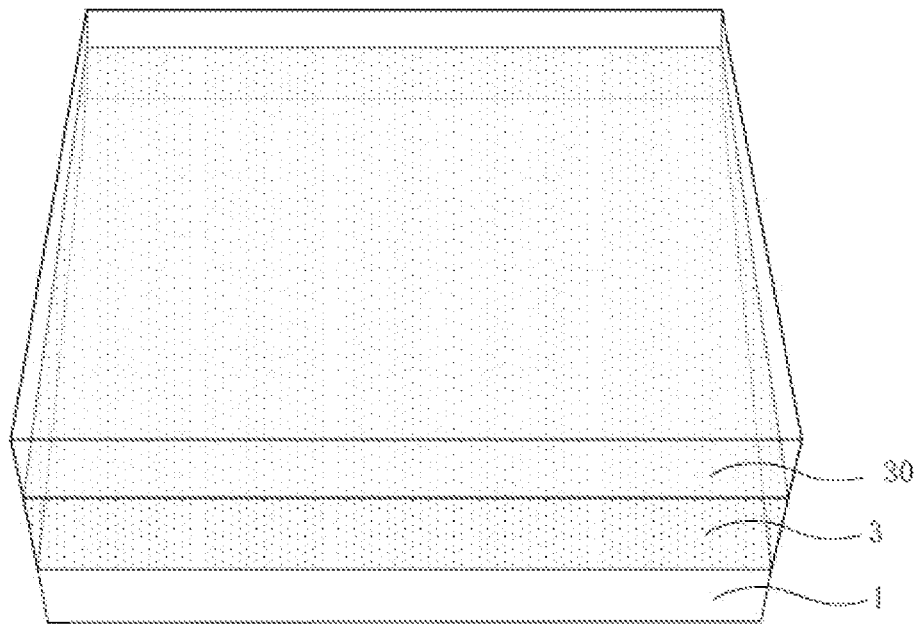
FIG. 9, FIG. 10, FIG. 11, and FIG. 12 are schematic structural diagrams of a structure obtained in step S12 according to an embodiment.
Figure 10:
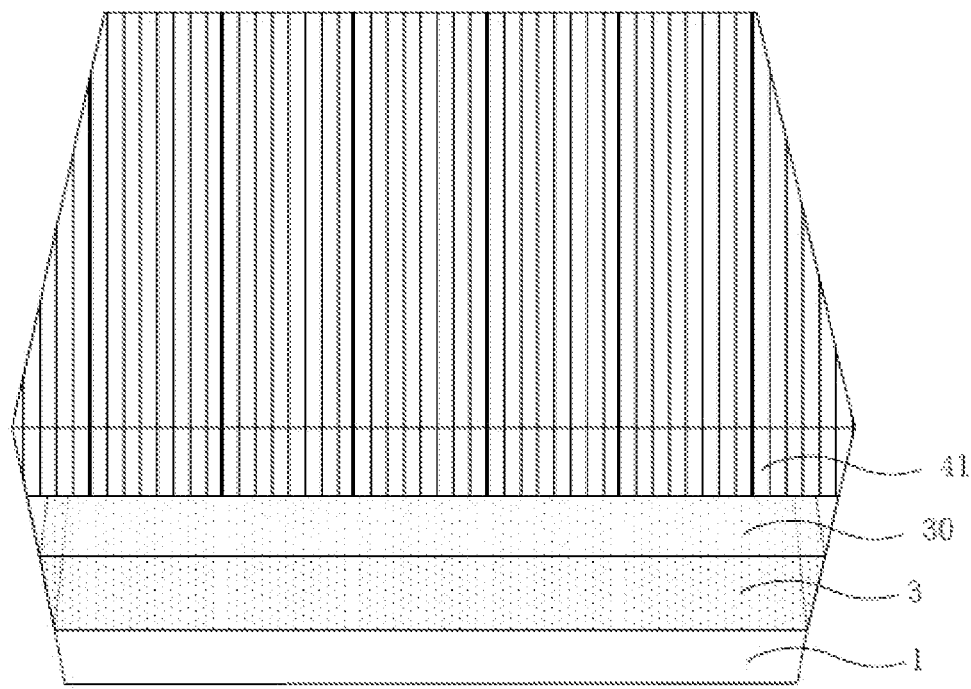
Figure 11:
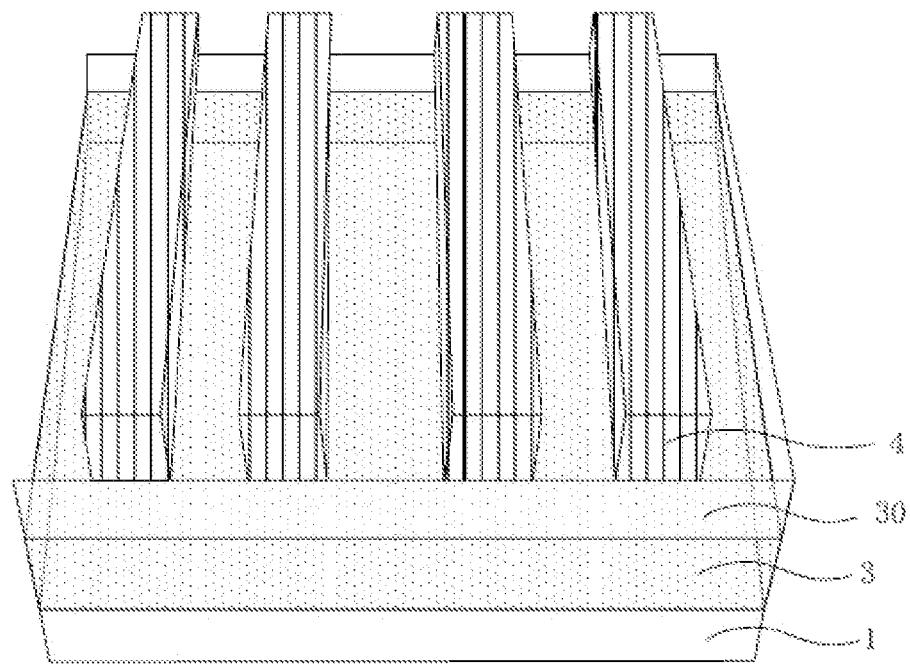

Referring to FIG. 9, FIG. 10, and FIG. 11, in some embodiments, forming the plurality of gate word lines 4 disposed in parallel at intervals on the common source line 3 includes the steps as described below.

In S121, as shown in FIG. 9, a first dielectric layer 30 is formed on an upper surface of the common source line 3.

Herein, the upper surface of the common source line 3 is a surface of the common source line 3 facing away from the substrate 1.

Optionally, the first dielectric layer 30 is formed by using an oxide material, for example, formed by using a silicon oxide material.

In S122, as shown in FIG. 10, a metal material layer 41 is formed on the first dielectric layer 30.

Optionally, the metal material layer 41 is formed through deposition by using a metal material with good electrical conductivity, for example, a metal material such as molybdenum (Mo), titanium (Ti), aluminum (Al), or tungsten (W).

In S123, as shown in FIG. 11, the metal material layer 41 is patterned, to form the plurality of gate word lines 4 disposed in parallel at intervals.

Herein, the patterning of the metal material layer 41 may be implemented by using a self-aligned double patterning (SADP) process or a self-aligned quadruple patterning (SAQP) process.

In addition, in some embodiments, referring to FIG. 12, S12 further includes the step as described below.

Figure 12:
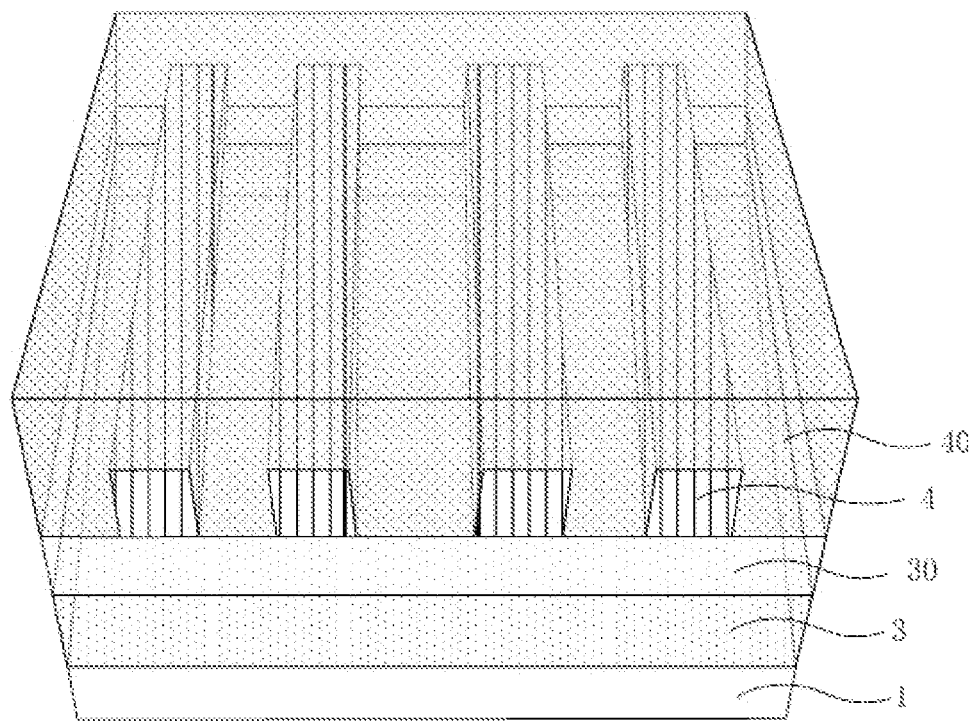

In S124, as shown in FIG. 12, a second dielectric layer 40 is formed on surfaces of the gate word lines 4 facing away from the substrate 1 and an exposed surface of the first dielectric layer 30, where the second dielectric layer 40 covers the gate word line 4.

The second dielectric layer 40 is configured to insulate adjacent gate word lines 4, and planarize a surface of a structure obtained after the gate word lines 4 are formed, to help perform a subsequent production process. A surface of the second dielectric layer 40 facing away from the substrate 1 may be planarized.

Optionally, the second dielectric layer 40 is formed by using an oxide material or an organic insulating material, for example, formed by using a silicon oxide material.

S13: Form a plurality of through holes provided in an array on the substrate, wherein the through hole penetrates the gate word line and extends to the upper surface of the common source line; and through holes in adjacent rows are staggered in a row direction, and through holes in adjacent columns are staggered in a column direction.

Figure 13:
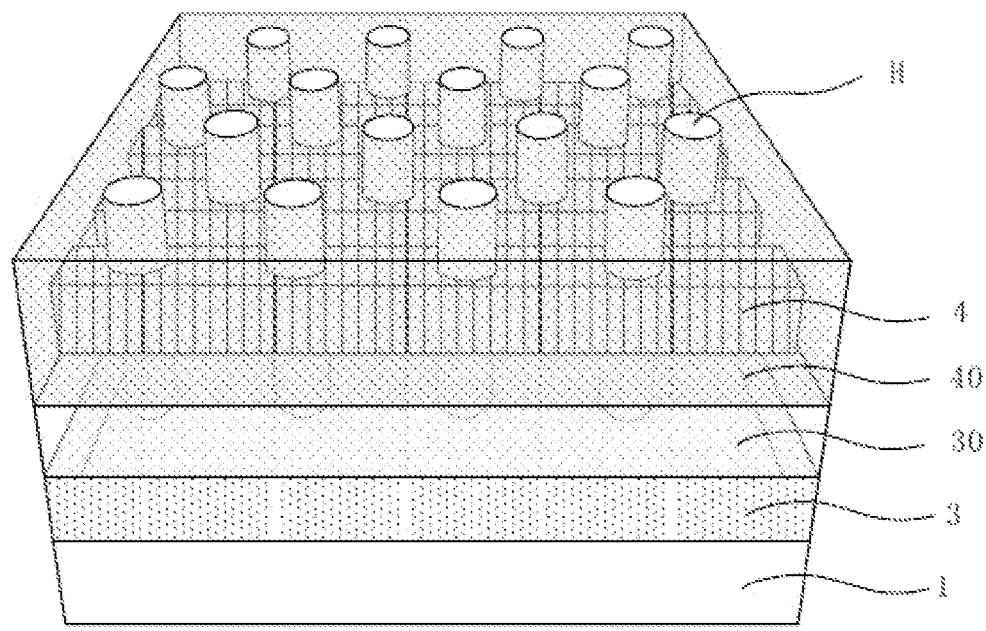
FIG. 13 is a schematic structural diagram of a structure obtained in step S13 according to an embodiment.

Referring to FIG. 13, in some embodiments, forming a plurality of through holes H provided in an array on the substrate 1 includes: forming a plurality of through holes H that penetrate the second dielectric layer 40, the gate word line 4, and the first dielectric layer 30, where the through hole H exposes a part of the common source line 3.

The objective of forming the through hole H is to form a gate-all-around transistor 21 in the through hole H. In addition, in this embodiment of the present disclosure, the memory cell 2 is constituted by the memory module 22 and the gate-all-around transistor 21, and memory modules 22 are one-to-one correspondingly located on gate-all-around transistors 21. Therefore, a staggered distance between through holes H determines a staggered distance between memory cells 2. The schematic distribution of the through holes H may be correspondingly understood with reference to the schematic distribution of the memory cells 2 in some of the foregoing embodiments (for example, as shown in FIG. 2 and FIG. 3). Details are not described herein in this embodiment of the present disclosure.

Based on this, optionally, a distance between two adjacent through holes H in any row is a first distance, and a staggered distance of through holes H in adjacent columns in a column direction is less than the first distance.

Herein, the first distance is, for example, two times a minimum process size F. The minimum process size F is a minimum size that can be implemented in manufacturing using a process, which is also referred to as a key size, and may be used as a criterion for defining a manufacturing process level.

Optionally, the staggered distance of the through holes H in the adjacent columns in the column direction is less than or equal to a second distance. The second distance is greater than half of the first distance, and the second distance is less than the first distance. For example, the staggered distance of the through holes H in the adjacent columns in the column direction is equal to $\sqrt{3}F$.

Optionally, a value range of a staggered distance of through holes H in adjacent rows in a row direction includes: a closed interval from half of the first distance to 0.7 times the first distance. For example, a staggered distance $D_3$ of memory cells 2 in adjacent rows in the row direction is equal to F; correspondingly, a staggered distance $D_2$ of memory cells 2 in adjacent columns in the column direction is equal to $\sqrt{3}F$.

In this embodiment of the present disclosure, the through holes H in the adjacent rows are staggered in the row direction, the through holes H in the adjacent columns are staggered in the column direction, and the staggered distance of the through holes H in the adjacent columns in the column direction is less than the first distance, such that a size of a plane area that each memory cell 2 needs to occupy can be properly reduced on a premise of meeting a process manufacturing capability, thereby ensuring a higher distribution density of the plurality of memory cells 2.

S14: Form a gate dielectric layer on a sidewall of the through hole, and form a columnar structure on an inner side of the gate dielectric layer, where a bottom of the columnar structure is in contact with the common source line, and a top of the columnar structure is higher than an upper surface of the gate dielectric layer.

Figure 14:
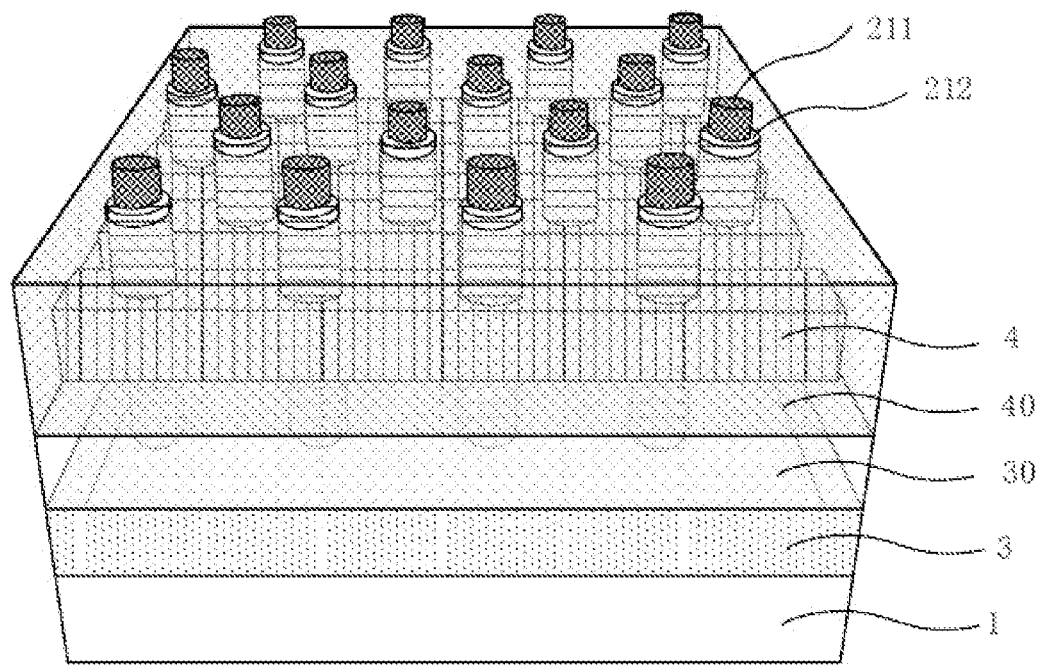
FIG. 14 is a schematic structural diagram of a structure obtained in step S14 according to an embodiment.

Herein, referring to FIG. 14, the gate dielectric layer 212 and the columnar structure 211 may be formed by using a deposition process, for example, an atomic layer deposition process. After the columnar structure 211 is formed, chemical mechanical polishing may be performed on an upper surface of the columnar structure 211, to help form a storage node contact structure 5 on the columnar structure 211 subsequently, thereby ensuring that the columnar structure 211 can be in good electrical contact with the storage node contact structure 5.

In addition, optionally, an upper surface of the gate dielectric layer 212 (that is, a surface thereof facing away from the substrate 1) is higher than an upper surface of the second dielectric layer 40, or is flush with an upper surface of the second dielectric layer 40.

In some embodiments, the gate dielectric layer 212 may be formed by using a material with a high k dielectric constant. For example, the material of the gate dielectric layer 212 includes: aluminum oxide ($Al_2O_3$), hafnium oxide ($HfO_2$), hafnium oxide nitrogen (HfON), zirconium oxide ($ZrO_2$), tantalum oxide ($Ta_2O_5$), titanium oxide ($TiO_2$), or strontium titanium oxide ($SrTiO_3$).

In some embodiments, the columnar structure 211 may be formed by using a metal oxide semiconductor material. For example, the material of the columnar structure 211 includes indium gallium zinc oxide (IGZO), indium zinc oxide (IZO), or indium tin oxide (ITO).

With reference to the FIG. 4 and FIG. 14 for understanding, in this step, the gate dielectric layer 212 is located between the columnar structure 211 and the gate word line 4, and the gate dielectric layer 212 wraps a part of the columnar structure 211. The source 213 is located at the bottom of the columnar structure 211 and is in contact with the common source line 3. The drain 214 is located at the top of the columnar structure 211 and is configured to be in contact with the memory module 22. The drain 214 is the top of the columnar structure 211 higher than the upper surface of the gate dielectric layer 212.

Herein, the source 213 and the drain 214 may be constituted by some regions of the columnar structure 211, such that a part of the columnar structure 211 located between the source 213 and the drain 214 is a conductive channel. In this way, the gate dielectric layer 212 wraps at least the conductive channel. The gate word line 4 is located at the periphery of the gate dielectric layer 212.

It can be learned from the foregoing that the columnar structure 211, the gate dielectric layer 212, the source 213, the drain 214, and a part of the gate word line 4 may together constitute the gate-all-around transistor 21, where the part of the gate word line 4 is a gate of the gate-all-around transistor 21.

S15: Form a memory module on the top of the columnar structure.

It can be learned with reference to some of the foregoing embodiments that a quantity of memory modules 22 is the same as that of columnar structures 211, that is, one memory module 22 is correspondingly disposed on one columnar structure 211 (that is, on the drain 214 of the gate-all-around transistor 21). In this way, it is beneficial to ensuring that the memory device 100 has a relatively high density integration capability.

For example, the memory module 22 is an MRAM module. For example, the memory module 22 is an MTJ disposed in a columnar shape. Optionally, the MTJ includes a free layer, a fixed layer, and an oxide layer (Tunneling oxide) that are provided in a stacked manner in a direction far away from the substrate. However, this is not limited herein. Another type of memory module is also applicable.

Figure 15:
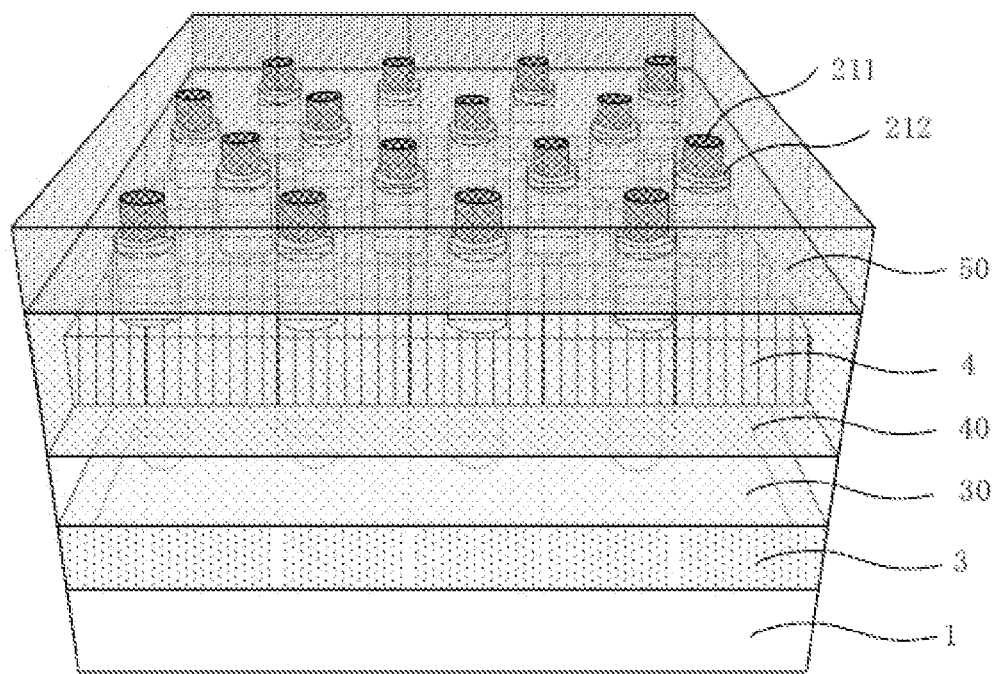
FIG. 15, FIG. 16, and FIG. 17 are schematic structural diagrams of a structure obtained in step S15 according to an embodiment.
Figure 16:
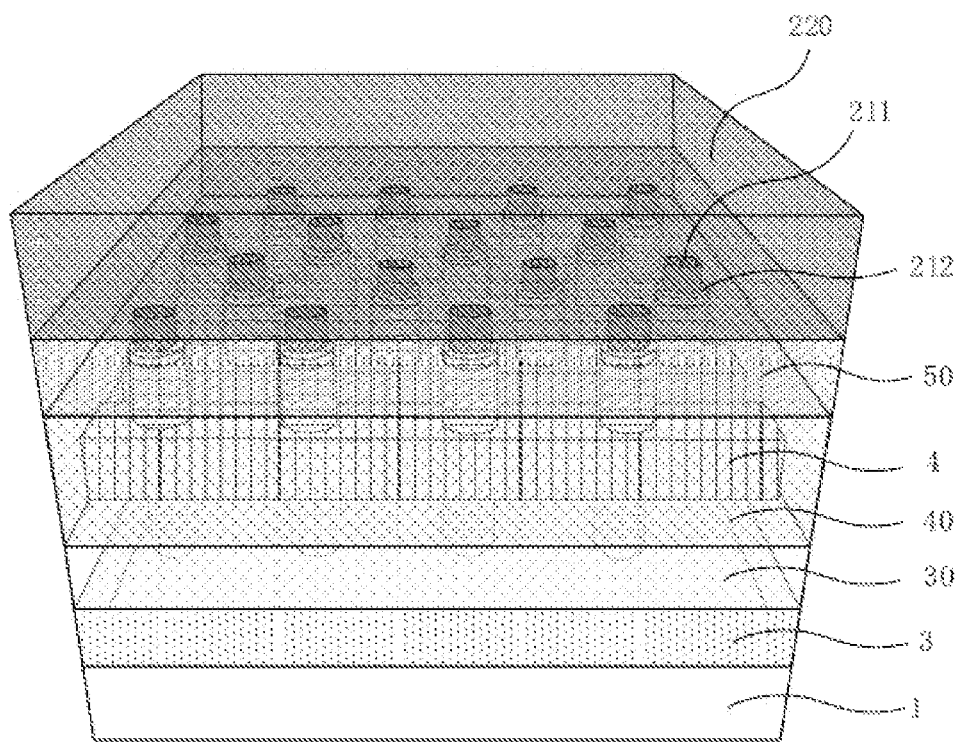
Figure 17:
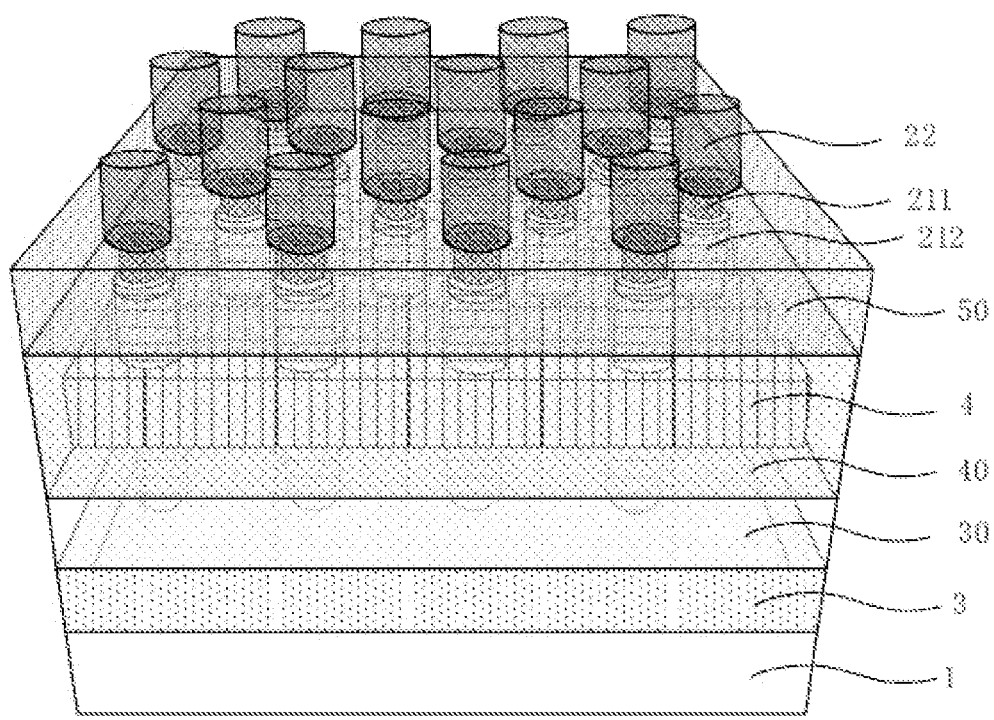

Based on this, referring to FIG. 15, FIG. 16, and FIG. 17, in some embodiments, forming the memory module 22 on the top of the columnar structure 211 includes the following steps.

In S151, as shown in FIG. 15, a third dielectric layer 50 that covers the second dielectric layer 40 and a surface of the gate dielectric layer 212 facing away from the substrate 1 is formed, and the surface of the third dielectric layer 50 facing away from the substrate 1 is flush with a surface of the columnar structure 211 facing away from the substrate.

Optionally, the third dielectric layer 50 is an oxide layer, for example, a silicon oxide layer. Alternatively, the third dielectric layer 50 is an organic insulating layer.

In S152, as shown in FIG. 16, an MTJ material layer 220 is formed on the top of the columnar structure 211 and an upper surface of the third dielectric layer 50.

Optionally, the MTJ material layer includes: a free material film, a fixed material film, and an oxide material film that are stacked.

In S153, as shown in FIG. 17, the MTJ material layer 220 is patterned, to form an MTJ (to be specific, the memory module 22) disposed in a columnar structure, and one MTJ is correspondingly located on one columnar structure 211.

Herein, the patterning of the MTJ material layer 220 may be implemented by using a self-aligned double patterning (SADP) process or a self-aligned quadruple patterning (SAQP) process.

S16: Form a plurality of bit lines disposed in parallel at intervals above the memory module, where the bit line extends in a second direction, and the bit line is correspondingly connected to the memory module; and the second direction intersects with, for example, is perpendicular to, the first direction.

Herein, the second direction is, for example, the column direction, or may be a direction provided at an included angle to the column direction.

Figure 18:
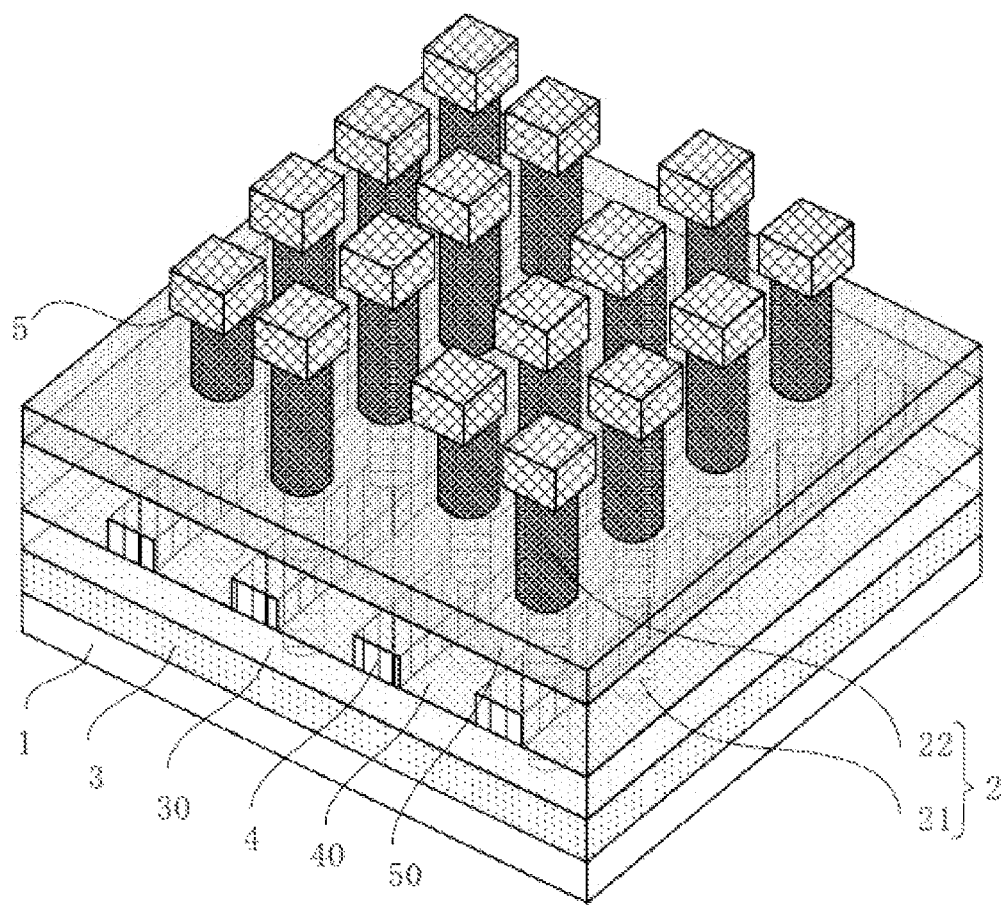
FIG. 18 and FIG. 19 are schematic structural diagrams of a structure obtained in step S16 according to an embodiment.
Figure 19:
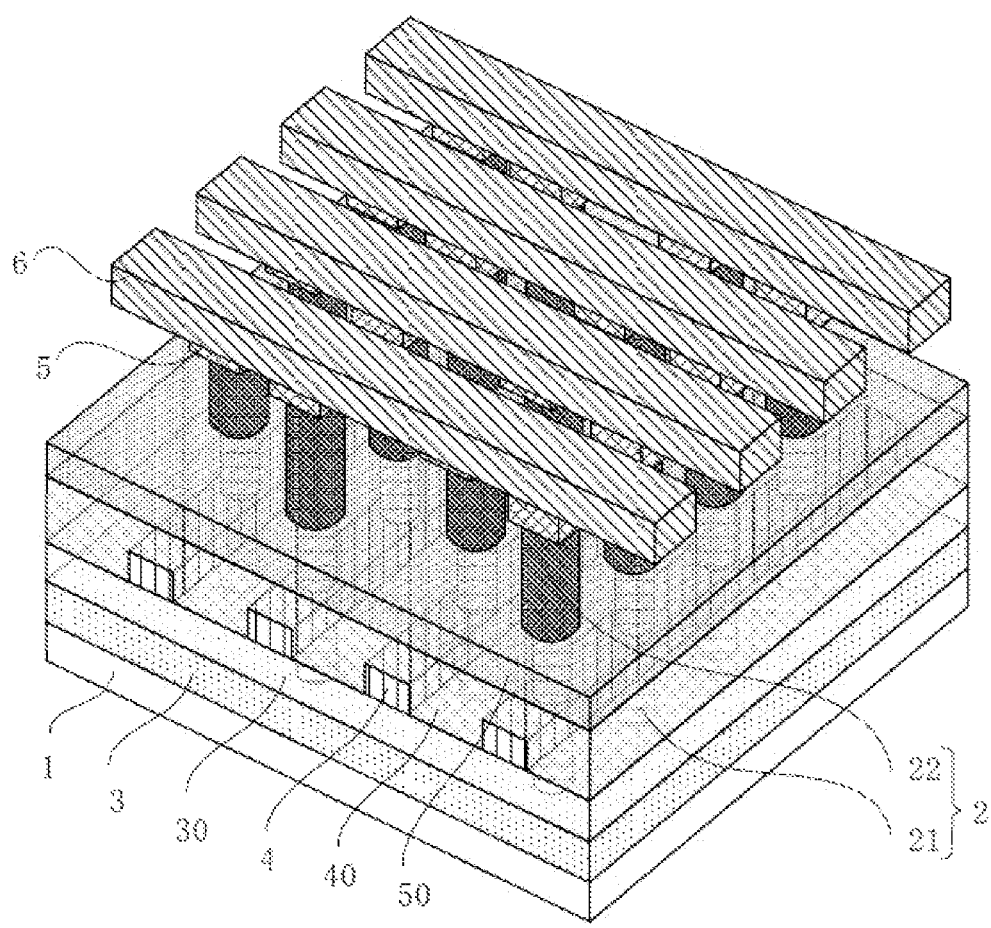

Referring to FIG. 18 and FIG. 19, in some embodiments, forming the plurality of bit lines 6 disposed in parallel at intervals above the memory module 22 includes the steps as described below.

In S161, as shown in FIG. 18, a storage node contact structure 5 is formed on a memory cell 2, for example, the memory module 22, where the storage node contact structure 5 covers at least a part of the memory module 22.

Optionally, shapes of orthographic projection of the storage node contact structure 5 on the substrate 1 include a rectangle. In this way, in a case that the memory module 22 is an MTJ disposed in a columnar shape, the storage node contact structure 5 adopts a rectangular structure, and the storage node contact structure 5 covers at least a part of the MTJ. This helps storage node contact structures 5 in adjacent columns have parts located on a same straight line or located in a region beside a same straight line.

Optionally, the storage node contact structure 5 is a metal pad, for example, a tungsten pad. Therefore, it can be ensured that the storage node contact structure 5 has a relatively low resistance value and relatively high stability.

In S162, as shown in FIG. 19, a plurality of bit lines 6 disposed in parallel at intervals on the storage node contact structure 5 are formed. The bit line 6 is correspondingly connected to the memory cell 2 through the storage node contact structure 5.

Optionally, the bit lines 6 extend in the column direction, and one bit line 6 is correspondingly connected to storage node contact structures 5 on memory cells 2 in two adjacent columns. The bit line 6 is, for example, a metal line, and may be formed by using a metal material with good electrical conductivity. This is not limited in this embodiment of the present disclosure.

In addition, the bit line 6 may be formed in a manner of first forming a metal material layer and then patterning the metal material layer. The patterning of the metal material layer may be implemented by using a self-aligned double patterning (SADP) process or a self-aligned quadruple patterning (SAQP) process.

In this embodiment of the present disclosure, the bit line 6 is located at a top of the memory cell 2, and one bit line 6 is correspondingly connected to memory cells 2 on two adjacent columns. In this way, in a case that the memory cells 2 have a relatively high distribution density, the bit line 6 can be designed to have a relatively large line width size, to effectively reduce a contact resistance between the bit line 6 and the memory cell 2 and avoid a high resistance caused by embedded arrangement of the bit line 6. This can ensure that the memory device 100 has good and stable storage performance while having a high-density integration capability.

The technical features of the foregoing embodiments can be employed in arbitrary combinations. To provide a concise description, all possible combinations of all technical features of the foregoing embodiments may not be described; however, these combinations of technical features should be construed as disclosed in this specification as long as no contradiction occurs.

The foregoing embodiments are intended to illustrate several implementations of the present application in detail, and they should not be construed as a limitation to the patentable scope of the present application. It should be noted that those of ordinary skill in the art can further make variations and improvements without departing from the conception of the present disclosure. These variations and improvements all fall within the protection scope of the present disclosure. Therefore, the protection scope of the present disclosure should be subject to the protection scope defined by the claims.

The invention claimed is:

1. A memory device, comprising:
a substrate,
a plurality of memory cells disposed in an array on the substrate, the array comprising a plurality of rows extending in a row direction and a plurality of columns extending in a column direction, wherein:
the row direction is parallel to a first direction defined by extension of gate word lines, the column direction is parallel to a second direction defined by extension of bit lines, and the second direction intersects the first direction;
the plurality of memory cells in adjacent rows are staggered in the row direction, such that a distance between two adjacent memory cells in any row is a first distance ($D_1$); and
the plurality of memory cells in adjacent columns are staggered in the column direction, such that a staggered distance ($D_2$) between memory cells in adjacent columns is less than the first distance; and
the bit lines disposed in the second direction, wherein the bit lines are located above the plurality of memory cells, and each of the bit lines is correspondingly connected to the memory cells on two adjacent columns; and
a common source line disposed between the substrate and the memory cells.

2. The memory device according to claim 1, wherein the staggered distance ($D_2$) in the column direction is less than or equal to a second distance; and the second distance is greater than half of the first distance, and the second distance is less than the first distance.

3. The memory device according to claim 1, wherein a staggered distance ($D_3$) of the memory cells in the adjacent rows in the row direction is less than or equal to half of the first distance.

4. The memory device according to claim 1, further comprising:
a plurality of gate word lines disposed in parallel at intervals and extending in the first direction, each gate word line is located above the common source line, and is correspondingly connected to the memory cells.

5. The memory device according to claim 4, wherein each memory cell comprises:
a gate-all-around transistor, disposed on the common source line and connected to the common source line, wherein the gate-all-around transistor is further correspondingly connected to one of the plurality of gate word lines; and
storage node, disposed on the gate-all-around transistor and connected to the gate-all-around transistor.

6. The memory device according to claim 5, wherein the storage node comprises a magnetic tunnel junction disposed in a columnar shape.

7. The memory device according to claim 5, wherein the gate-all-around transistor comprises:
a columnar structure, wherein a bottom of the columnar structure is in contact with the common source line, and a top of the columnar structure penetrates the gate word line and extends to the storage node;
a gate dielectric layer, located between the columnar structure and the gate word line, wherein the gate dielectric layer wraps a part of the columnar structure;
a source, located at the bottom of the columnar structure, and in contact with the common source line; and
a drain, located at the top of the columnar structure, and in contact with the storage node.

8. The memory device according to claim 7, wherein a material of the columnar structure comprises indium gallium zinc oxide.

9. The memory device according to claim 4, wherein
the common source line covers an entire surface of the substrate.

10. The memory device according to claim 4, wherein
the common source line is a transparent conductive layer, a molybdenum (Mo) layer, an aluminum (Al) layer, or a stacked layer of titanium (Ti) and gold (Au).

11. The memory device according to claim 1, further comprising:
a plurality of gate word lines disposed in parallel at intervals and extending in a first direction, each gate word line is below a bit line and is correspondingly connected to a memory cell.

12. The memory device according to claim 11, further comprising:
a plurality of storage node contact structures, wherein
the storage node contact structure is located on the memory cell, and covers at least a part of the memory cell; and
the bit line is located on a corresponding storage node contact structure, and is correspondingly connected to the memory cell through the corresponding storage node contact structure.

13. The memory device according to claim 11, wherein
each gate word line is a straight line extending in the first direction, and the first direction is perpendicular to the second direction.

14. The memory device according to claim 1, wherein
each of the bit lines is a straight line extending in the second direction, and the second direction is the column direction, or a direction provided at an inclined angle to the column direction.

\* \* \* \* \*